(12) United States Patent
Chen et al.

(10) Patent No.: US 7,384,566 B2
(45) Date of Patent: Jun. 10, 2008

(54) FABRICATION METHOD FOR PRINTED CIRCUIT BOARD

(75) Inventors: Hung-Nan Chen, Kaohsiung (TW); Jen-Kuang Fang, Pingtung (TW); Kuang-Lin Lo, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 219 days.

(21) Appl. No.: 11/121,091

(22) Filed: May 4, 2005

(65) Prior Publication Data

US 2005/0246892 A1    Nov. 10, 2005

(30) Foreign Application Priority Data

May 7, 2004    (TW) ............................... 93112869 A

(51) Int. Cl.
*H01B 13/00*    (2006.01)
*H05K 3/02*    (2006.01)

(52) U.S. Cl. .......................................... 216/13; 29/847

(58) Field of Classification Search .................. 216/13, 216/14, 15, 17, 18; 29/829, 846, 847
See application file for complete search history.

(56) References Cited

U.S. PATENT DOCUMENTS 6,312,614 B1 *   11/2001   Arimitsu et al. ............... 216/13
6,319,750 B1 *   11/2001   Huang et al. ............... 438/106
6,399,417 B1 *    6/2002   Lee et al. .................... 438/106
2003/0075792 A1*  4/2003   Ruhland ...................... 257/693

FOREIGN PATENT DOCUMENTS

JP          07106370 A    *   4/1995

* cited by examiner

*Primary Examiner*—Roberts Culbert
(74) *Attorney, Agent, or Firm*—Birch, Stewart, Kolasch & Birch, LLP

(57) ABSTRACT

A fabrication method for PCBs. The method includes providing a substrate having a layout area and a periphery area around the layout area on a surface, forming a patterned wiring layer, having a bus line in the periphery area, a plurality of pads in the layout area, a plurality of bridge lines providing electrical connection between the pads, and a plating line electrically connecting the bus line and pads, overlying the substrate, forming a patterned solder mask over the substrate and wiring layer, the patterned solder mask having a plurality of first openings respectively exposing the pads and plating a metal layer respectively overlying the pads, forming a plurality of second openings respectively exposing the bridge lines between the pads, and removing the exposed bridge lines.

10 Claims, 17 Drawing Sheets

FABRICATION METHOD FOR PRINTED CIRCUIT BOARD

BACKGROUND

The present invention relates to a fabrication method for a printed circuit board (PCB), and more particularly to a method of plating a metal layer of the PCB.

PCBs, such as substrates for ball grid array (BGA) packages, generally have exposed pads or fingers for connection to an external device.

In FIG. 1, a top view of an exemplary portion of a PCB for a BGA substrate is shown. Fingers 140 disposed a chip attachment area 120. Trace lines 150 on a top surface respectively extend from fingers 140 to via holes 160 and electrically connect to pads 130 on a bottom surface using trace lines on the bottom surface. A bus line 180, disposed an edge of the PCB, electrically connects to trace lines 150, fingers 140, and pads 130 using branch plating lines 181. The pads 130, fingers 140, trace lines 150, bus line 180, and branch plating lines 181 are typically copper. The pads 130 and fingers 140 are typically exposed for electrical connection to external devices (not shown). The pads 130 and fingers 140 are usually plated with a Ni/Au layer (not shown) by electrical plating where current flows to every pad 130 and finger 140 using bus line 180 and branch plating lines 181 to prevent the exposed pads 130 and fingers 140 from oxidation.

The connections between respective trace lines 150 and bus lines 180 are cut by a step to separate an encapsulated package from the PCB. The branch lines 181, however, remain in the package.

Due to the demand for small-aspect, light and powerful electronic products, PCB design rules demand to layouts with increased density, resulting in increased overall density and reduced pitch in the remained branch lines 181. Thus, a crosstalk effect resulting from mutual inductance and mutual capacitor between the branch lines 181 may not only negatively affect transmission of electrical signals and system stability, but also deviate character impedances of trace lines 150, thereby further negatively affecting the electrical performance of an end product using the PCB.

SUMMARY

Thus, embodiments of the invention provide a fabrication method for PCBs, capable of reducing density and length of remaining plating lines to improve electrical performance of end product using the PCB.

Embodiments of the invention provide a fabrication method for PCBs. First, a substrate, having a layout area and a periphery area around the layout area on a surface, is provided. Then, a patterned wiring layer, having a bus line in the periphery area, a plurality of pads in the layout area, a plurality of bridge lines electrically connecting between the pads, and a plating line electrically connecting the bus line and pads, is formed overlying the substrate. Next, a patterned solder mask is formed over the substrate and wiring layer. The patterned solder mask has a plurality of first openings respectively exposing the pads. Next, a metal layer is plated respectively overlying the pads. A plurality of second openings is further formed in the solder mask, respectively exposing the bridge lines between the pads. Finally, the exposed bridge lines are removed.

Embodiments of the invention further provide a fabrication method for PCBs. First, a substrate, having a layout area and a periphery area around the layout area on a surface, is provided. Then, a patterned wiring layer, having a bus line in the periphery area, a plurality of pads in the layout area, a plurality of bridge lines providing electrical connection between the pads, a branch bridge line providing electrical connection between a node in one of the bridge lines and one of the pads, and a plating line electrically connecting the bus line and pads, is formed overlying the substrate. Next, a patterned solder mask is formed over the substrate and wiring layer. The patterned solder mask has a plurality of first openings respectively exposing the pads. Next, a metal layer is plated respectively overlying the pads. A plurality of second openings is further formed in the solder mask, respectively exposing the bridge lines between the pads, the plating line between the bus line and pads, and the node. Finally, the exposed bridge lines, plating line, and node are removed.

BRIEF DESCRIPTION OF THE DRAWINGS

Embodiments of the invention can be more fully understood by reading the subsequent detailed description in conjunction with the examples and references made to the accompanying drawings, wherein.

DETAILED DESCRIPTION

The following embodiments are intended to illustrate the invention more fully without limiting the scope of the claims, since numerous modifications and variations will be apparent to those skilled in this art.

FIGS. 2A through 2J are top views illustrating a first embodiment of a fabrication method for PCBs of the invention.

Figure 1:
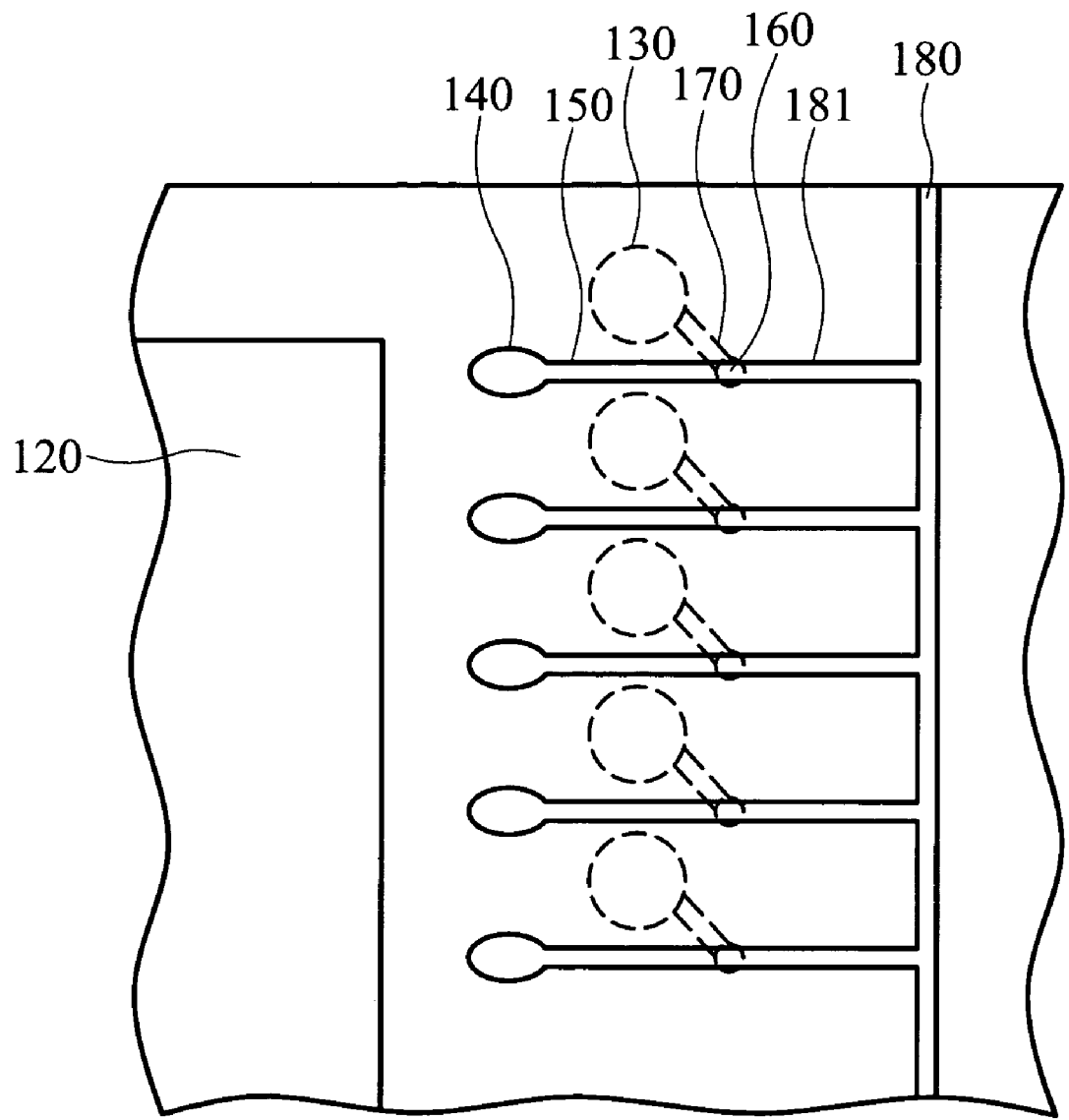
FIG. 1 is a top view of a conventional PCB.
Figure 2A:
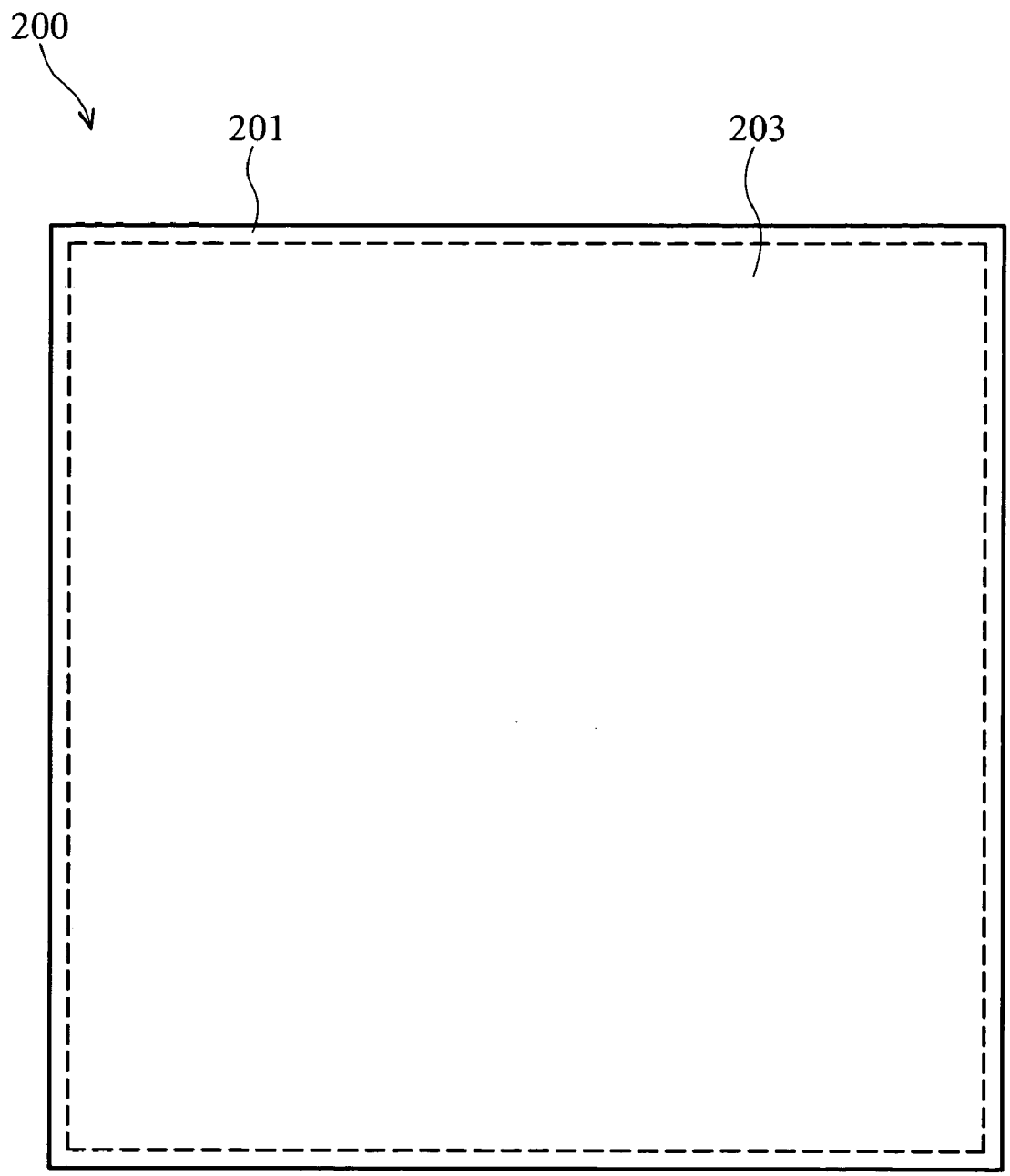
FIGS. 2A through 2J are top views of a fabrication method of PCBs of a first embodiment of the invention.

In FIG. 2A, first, a substrate 200, such as a core substrate comprising fiber-reinforced or particle-reinforced materials such as epoxy resin, bismaleimide triazine-based (BT), Cyanate ester, or other materials, is provided. The substrate 200 may also be a core substrate plated with a patterned wiring with an overlying dielectric layer. One surface of substrate 200, such as that for connection in an external device1 has a periphery area 201 and layout area 203.

FIGS. 2B through 2J illustrate an exemplary portion of the PCB of the invention. In practice, the quantity, shape, and size of the elements shown in the figures may be modified.

Figure 2B:
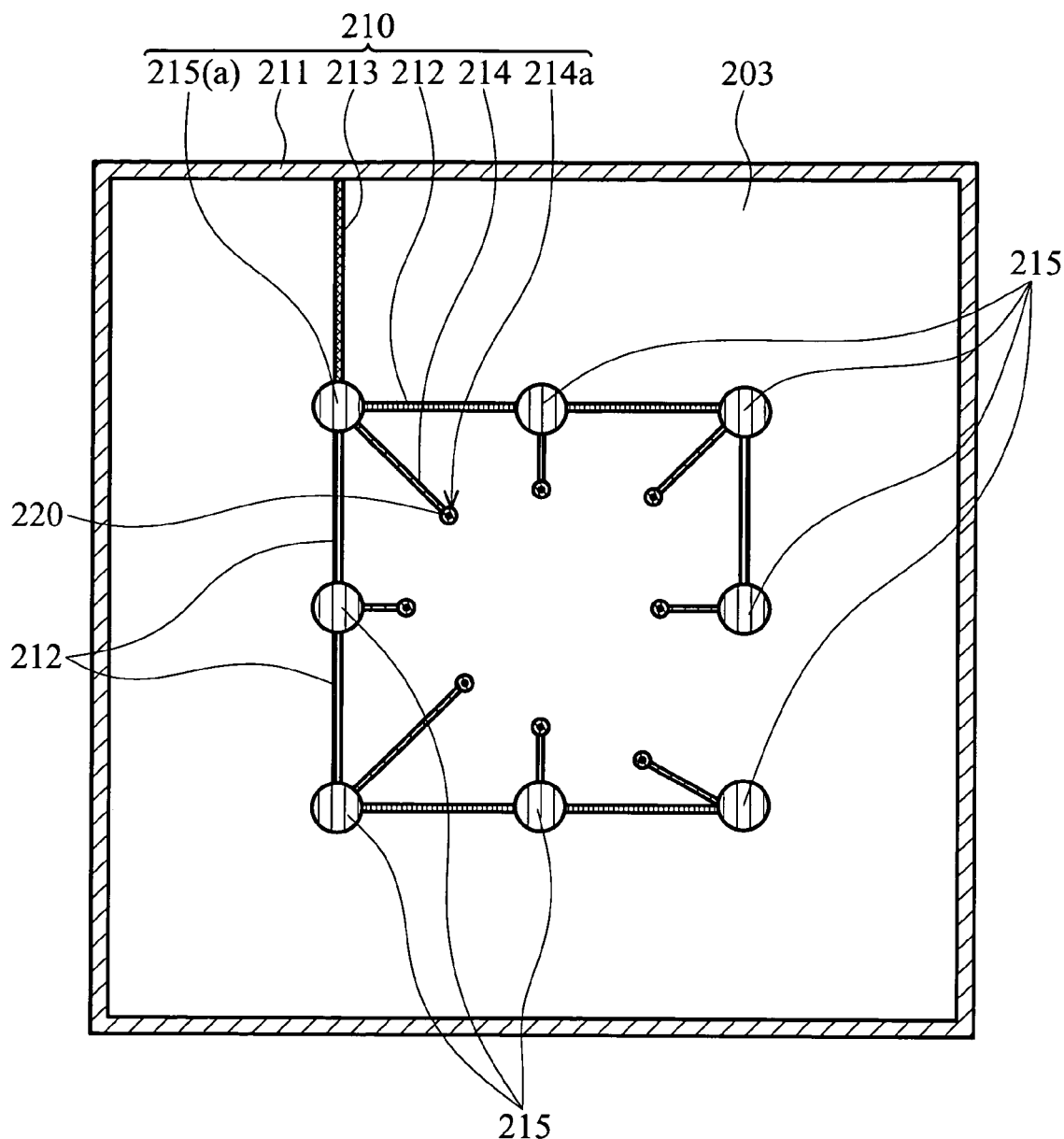
Figure 2C:
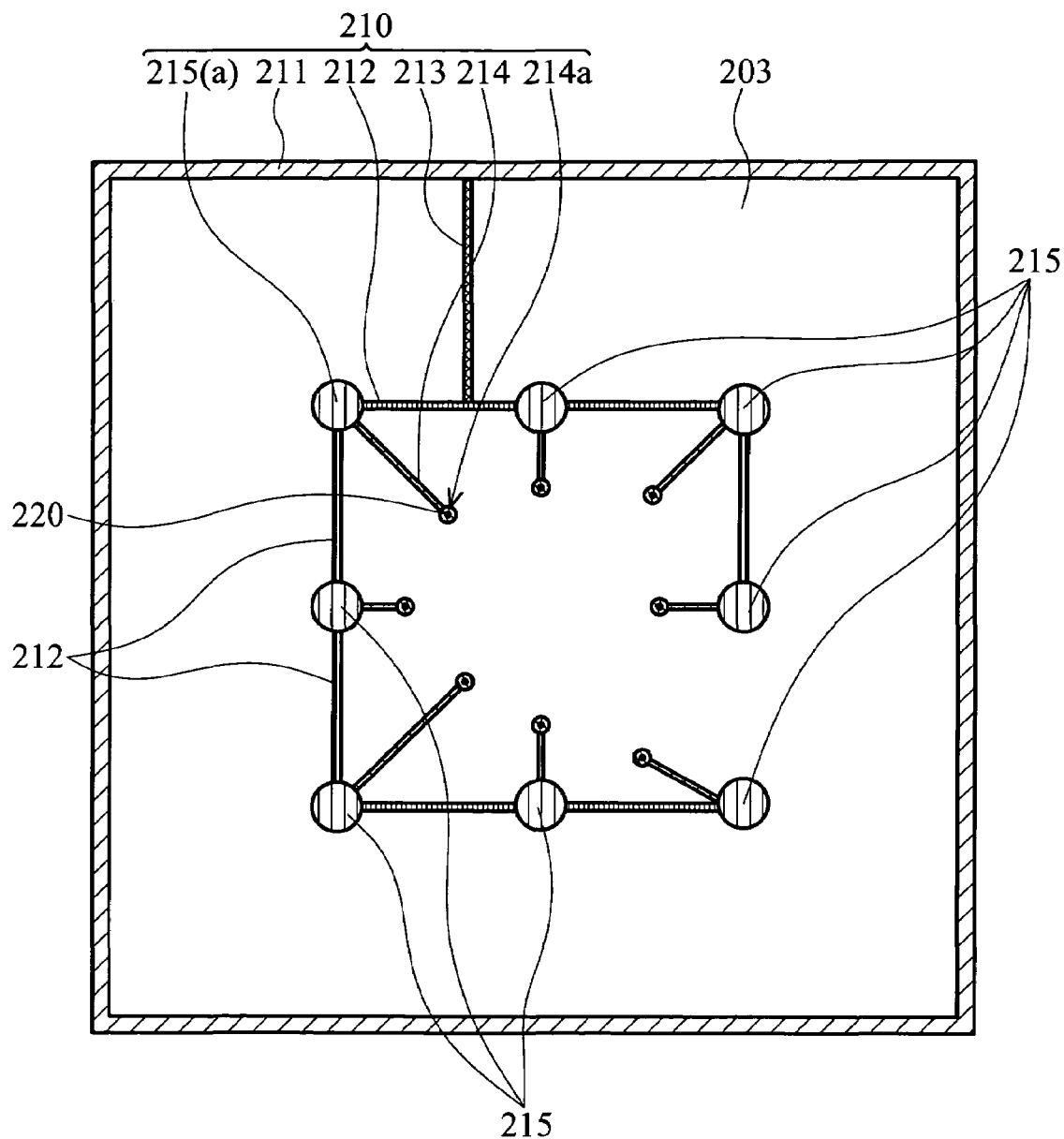

In FIGS. 2B and 2C, a wiring layer 210 is formed overlying the surface of substrate 200. Formation of wiring layer 210 includes the following steps. A metal layer such as copper is formed overlying substrate 200, followed by drilling at a predetermined position on substrate 200 to form via holes (such as the subsequent terminals 214a) through the metal layer and substrate 200, providing means for electrical connection of wiring layer 210 to an underlying wiring (not shown). Following drilling of the via holes, a layer of substantially the same material as the metal layer, such as copper, is formed overlying sidewalls of the via holes for electrical connection between the wiring layer 210 and its underlying wiring. A dielectric plug 220 is then filled in the via holes, followed by patterning of the metal layer to complete the wiring layer 210.

The wiring layer 210 includes a bus line 211 in the periphery area 201 (further referring to FIG. 2A), a plurality of pads arranged in a predetermined pattern in the layout area 203, and a plurality of bridge lines 212 electrically connecting between each pad 215. The shown layout of bridge lines 212 provides electrical connections of other pads 215 to pad 215a, which may also be fulfilled by other layouts.

The wiring layer 210 further includes a plating line 213 providing electrical connection between the bus line 211 and pads 215. Two exemplary layouts of the plating line 213 are respectively shown in FIGS. 2B and 2C. The plating line 213 is between the bus line 211 and at least one of the pads 215 (pad 215a) in FIG. 2B, and between the bus line 211 and at least one of the bridge lines 212 in FIG. 2C.

The wiring layer 210 further includes a plurality of trace lines 214. Each pad 215 is a terminal of the respective trace line 214 and electrically connects thereto. The other terminal of every trace line 214, as described, is the respective via hole.

The flow shown in FIGS. 2D through 2J may follow the step shown in FIG. 2B or 2C, but follows FIG. 2B in this embodiment. Those skilled in the art may develop a substantially equivalent flow following the step shown in FIG. 2C.

The flow shown in FIGS. 2D through 2J forms a patterned solder mask 230, and is given as an example and not intended to limit the scope of the present invention. Those skilled in the art will recognize the possibility of utilizing various flows to achieve the patterned solder mask 230.

Figure 2D:
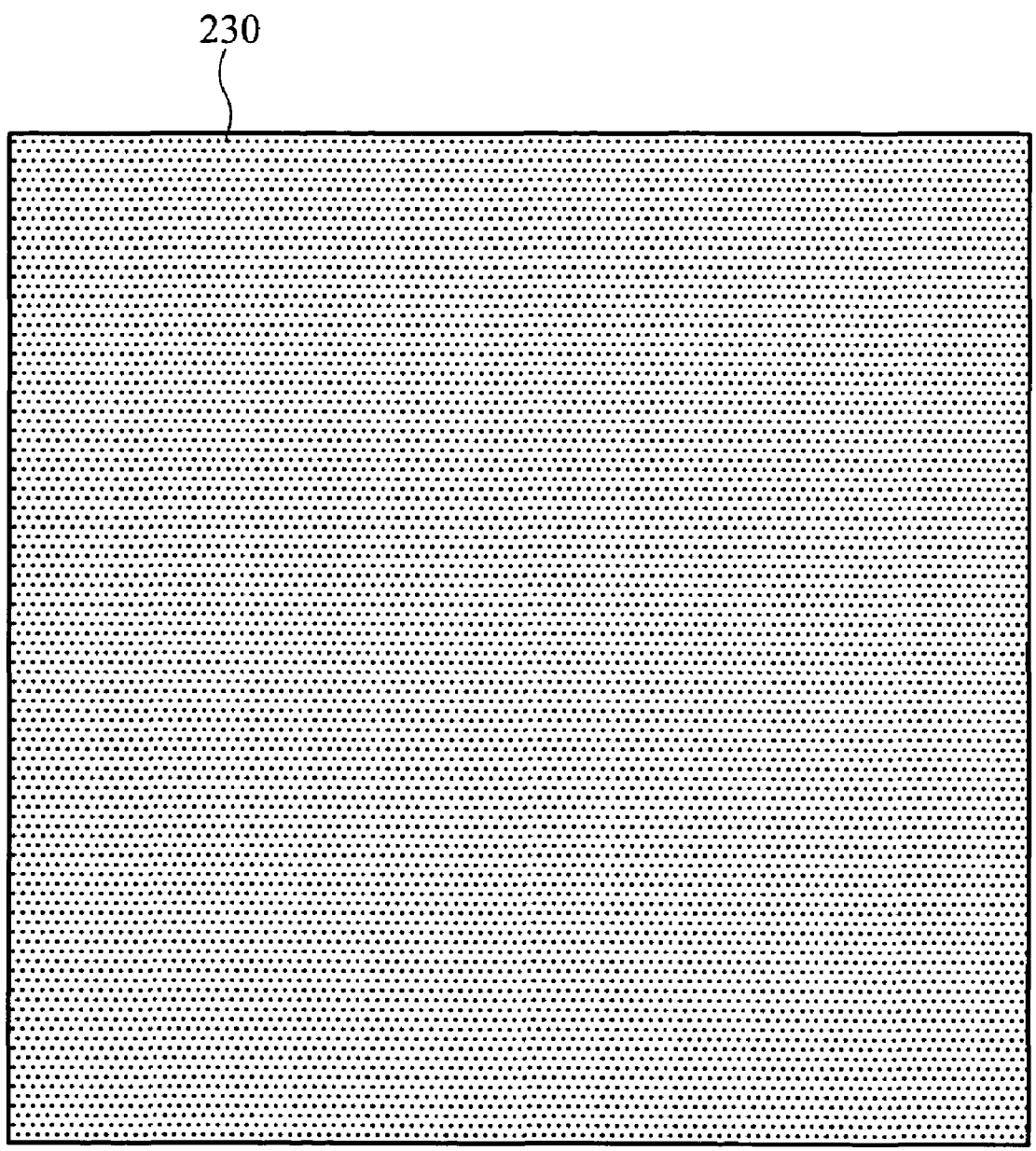

In FIG. 2D, a solder mask 230 is formed over the substrate 200 (further referring to FIG. 2A) and wiring layer 210 (further referring to FIG. 2B).

Figure 2E:
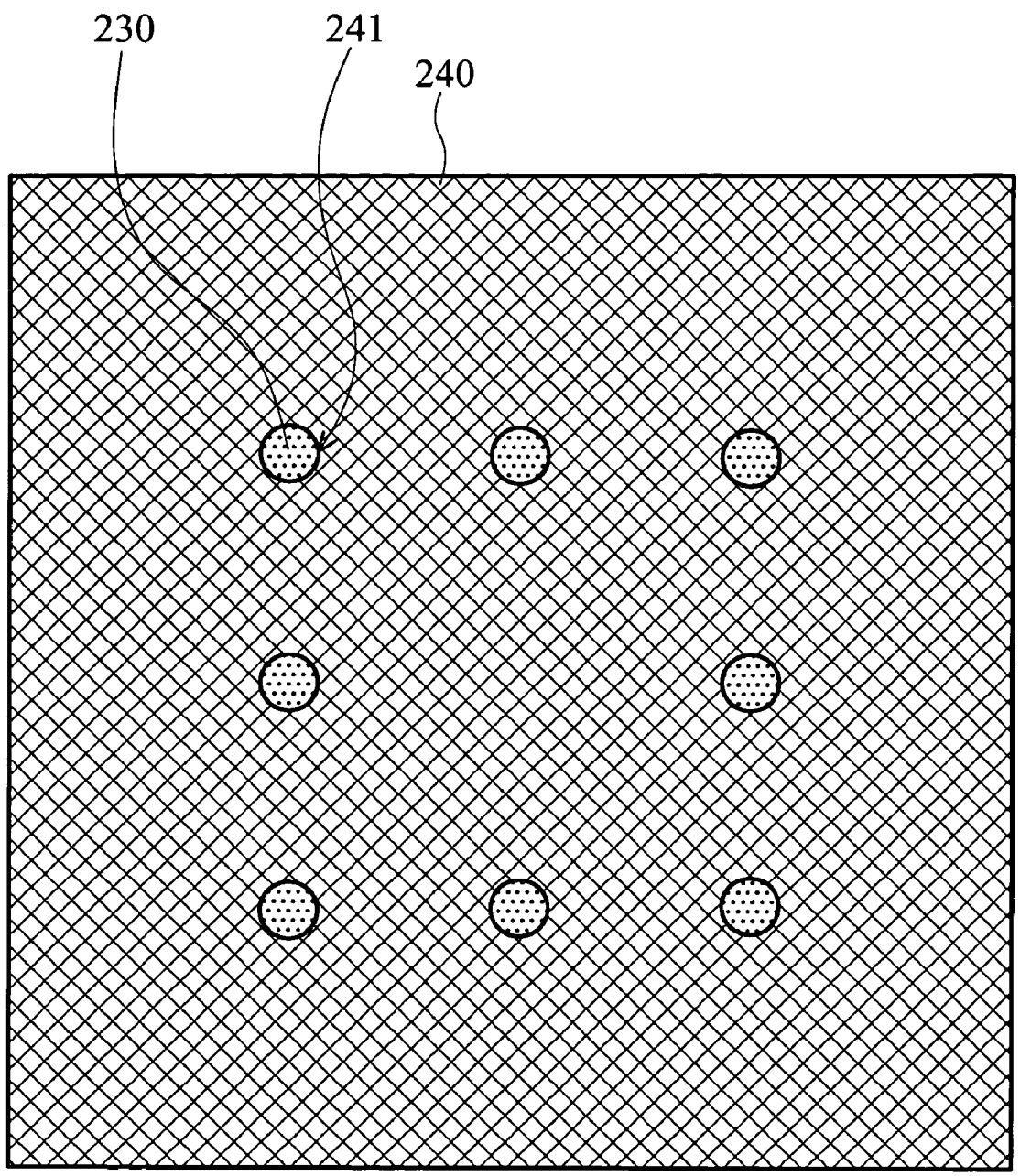

In FIG. 2E, a patterned resist layer 240 is formed overlying the solder mask 230. The resist layer 240 comprises a plurality of openings 241 exposing parts of the solder mask 230 at predetermined positions to form the subsequent openings 231 (further referring to FIG. 2F).

Figure 2F:
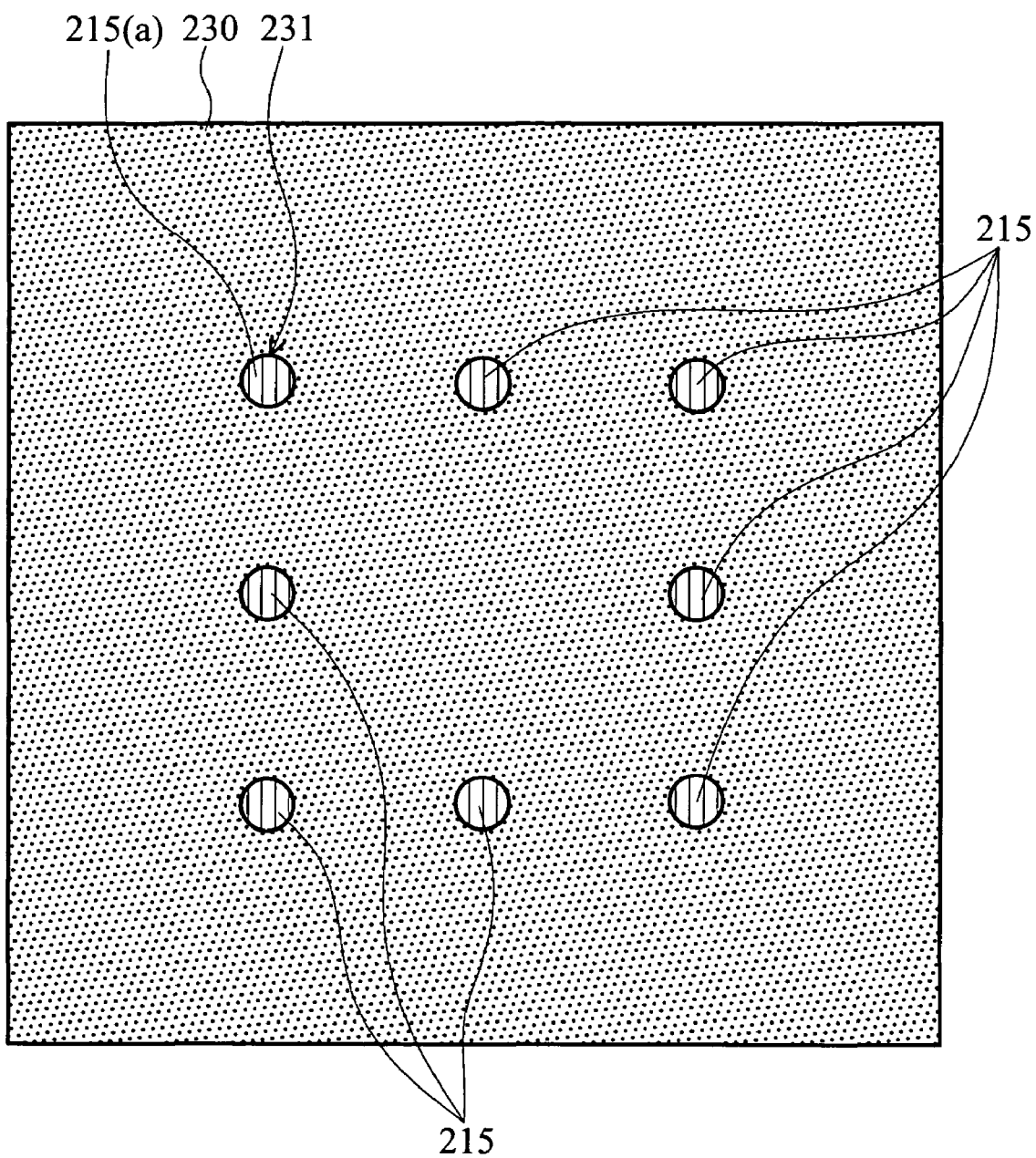

The exposed solder mask 230 is etched using resist layer 240 as an etching mask. The etching stops when the underlying pads 215 are exposed, and removal of the resist layer 240 follows. Thus, the patterned solder mask 230, comprising a plurality of first openings 231 respectively exposing the pads predetermined for coating, is achieved as shown in FIG. 2F.

Figure 2G:
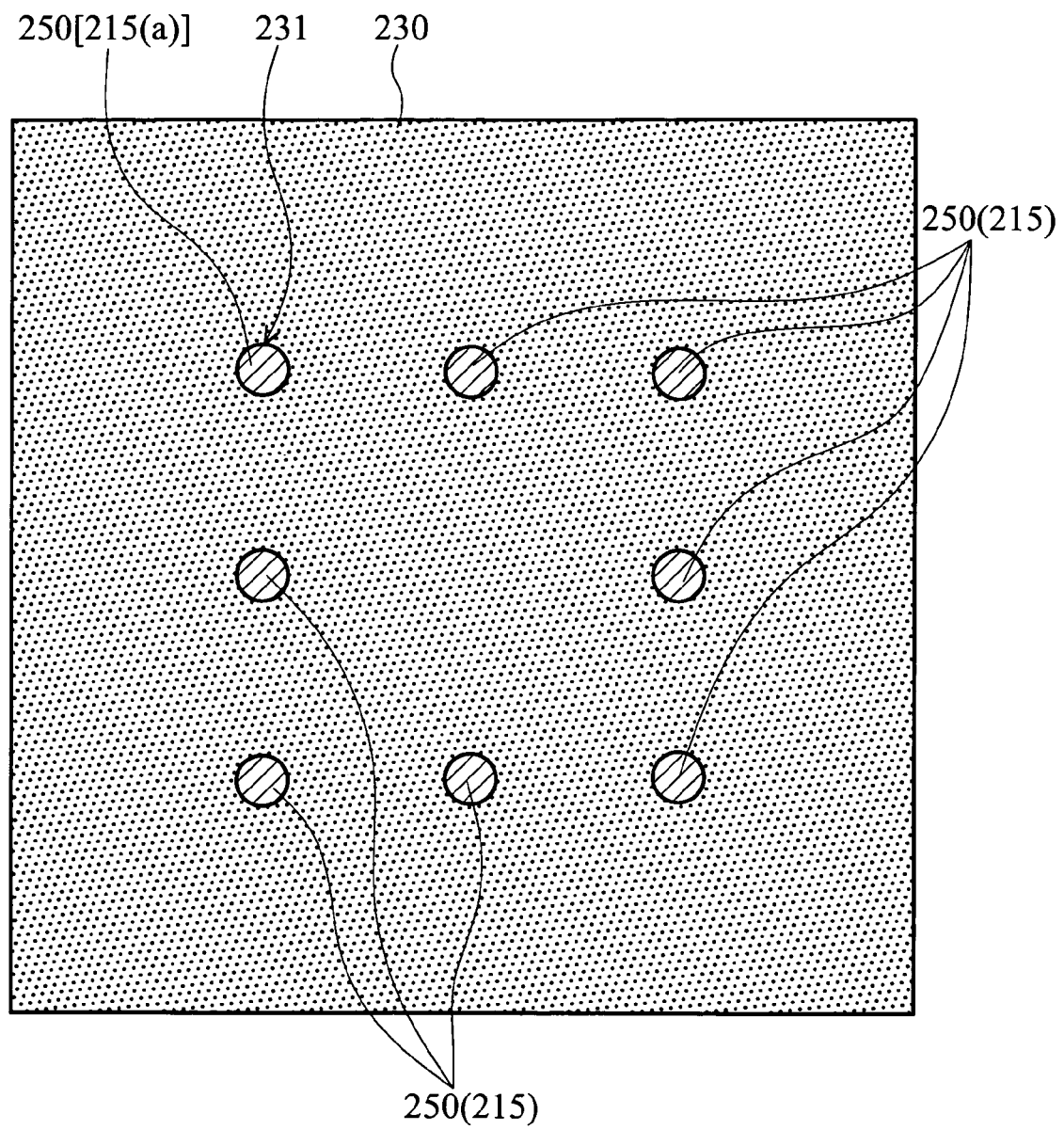

In FIG. 2G, the substrate 200 is immersed in an electrobath, followed by conducting current to each exposed pad 215 from bus line 211 via plating line 213, exposed pad 215a, and bridge lines 212 (further referring to FIG. 2B) sequentially. Thus, a metal layer 250, such as a Ni/Au layer, is plated overlying the respective pads 215.

Figure 2H:
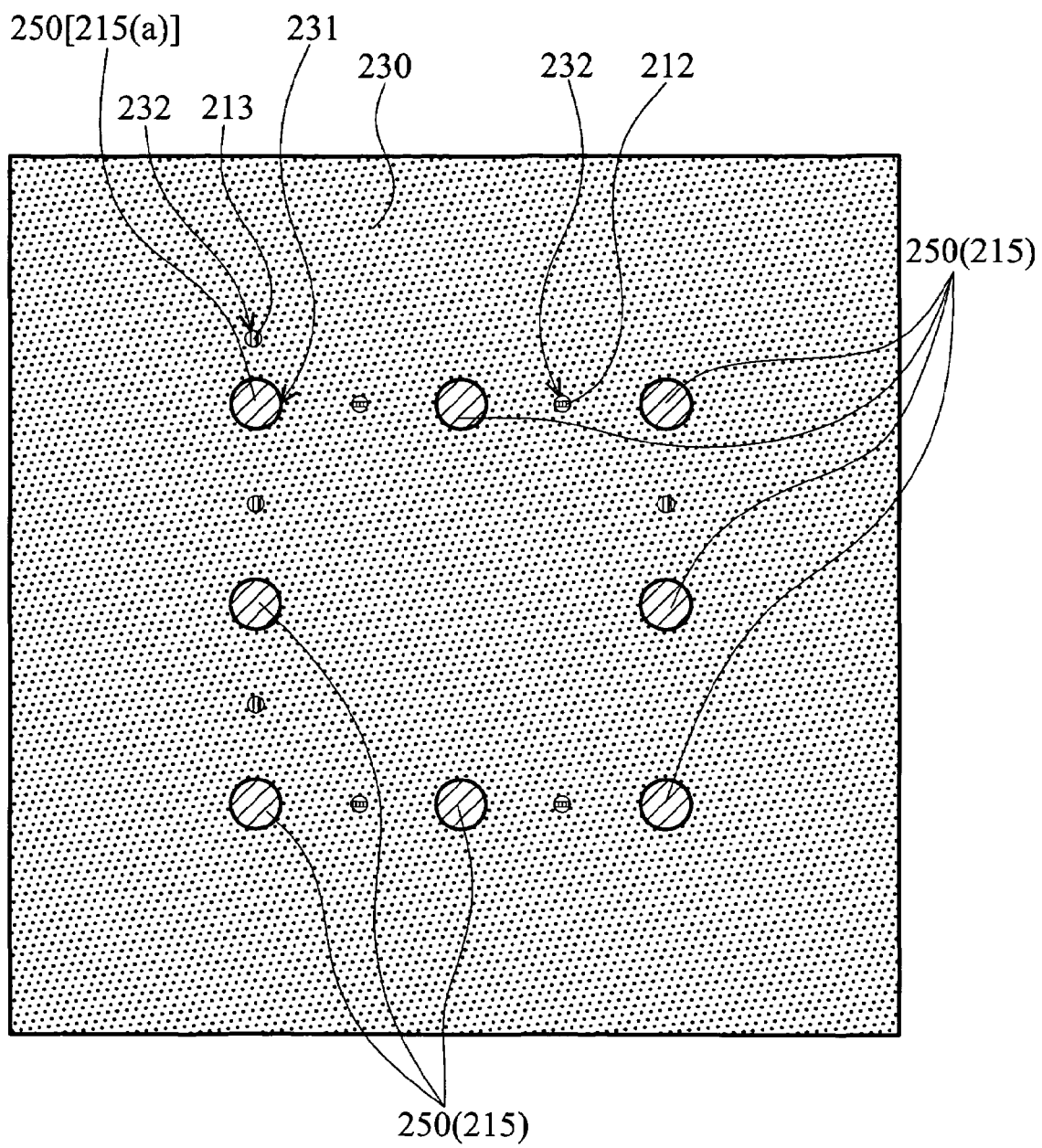

In FIG. 2H, a plurality of second openings 232 are formed in the solder mask 230, exposing the bridge lines 212 between the pads 215 predetermined for coating, by a method such as laser absorbing or photolithography. When the PCB fabricated by the method of this embodiment is a BGA substrate, the bus line 211 is cut in the subsequent packaging process. One second opening 232 to expose a part of the plating line 213 is optionally formed.

Figure 2I:
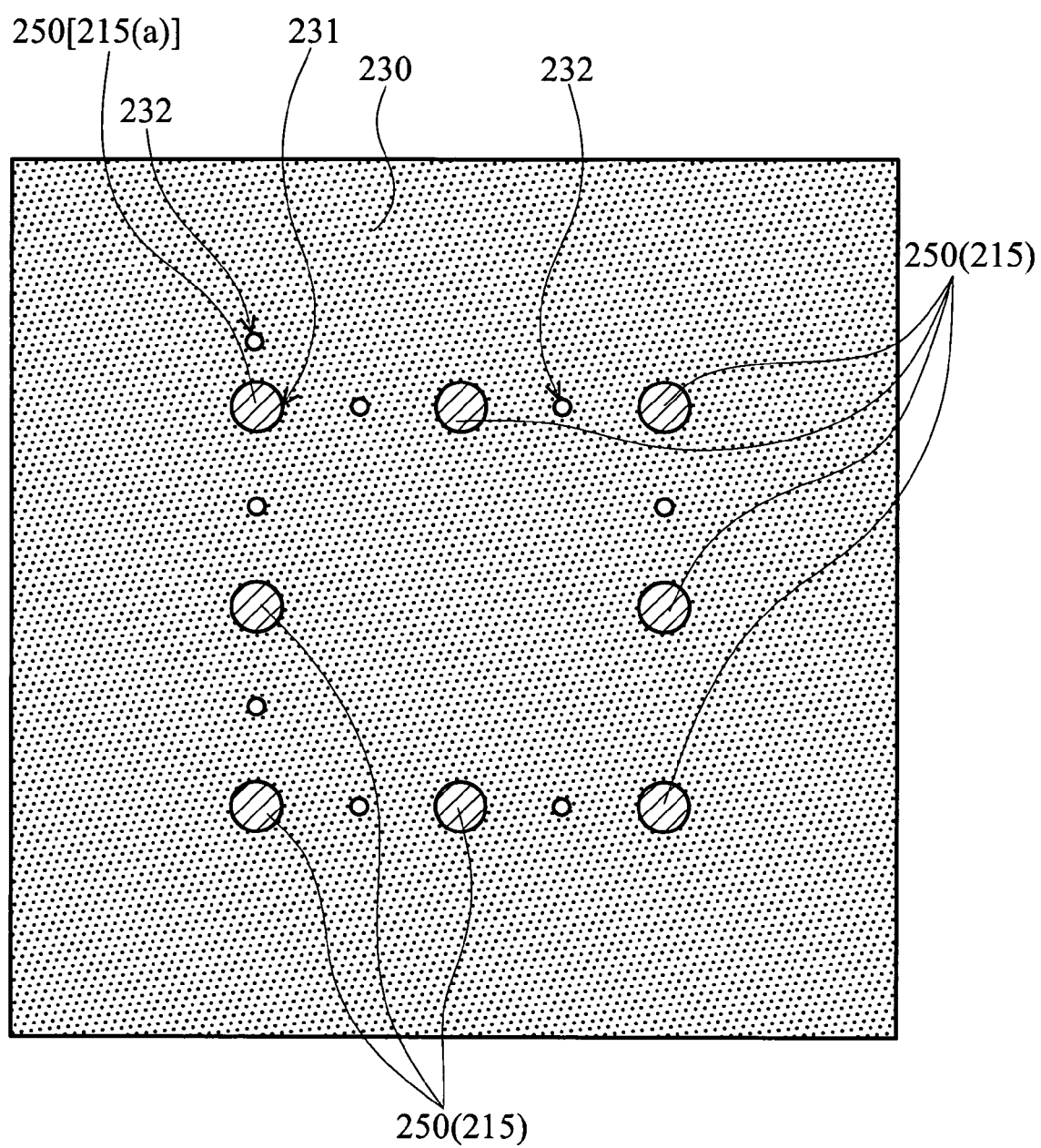

Finally, in FIG. 2I, the exposed bridge lines 212 are removed by a method such as etching or laser absorbing. When a part of the plating line 213 is optionally exposed, the exposed plating line 213 is removed simultaneously.

Figure 2J:
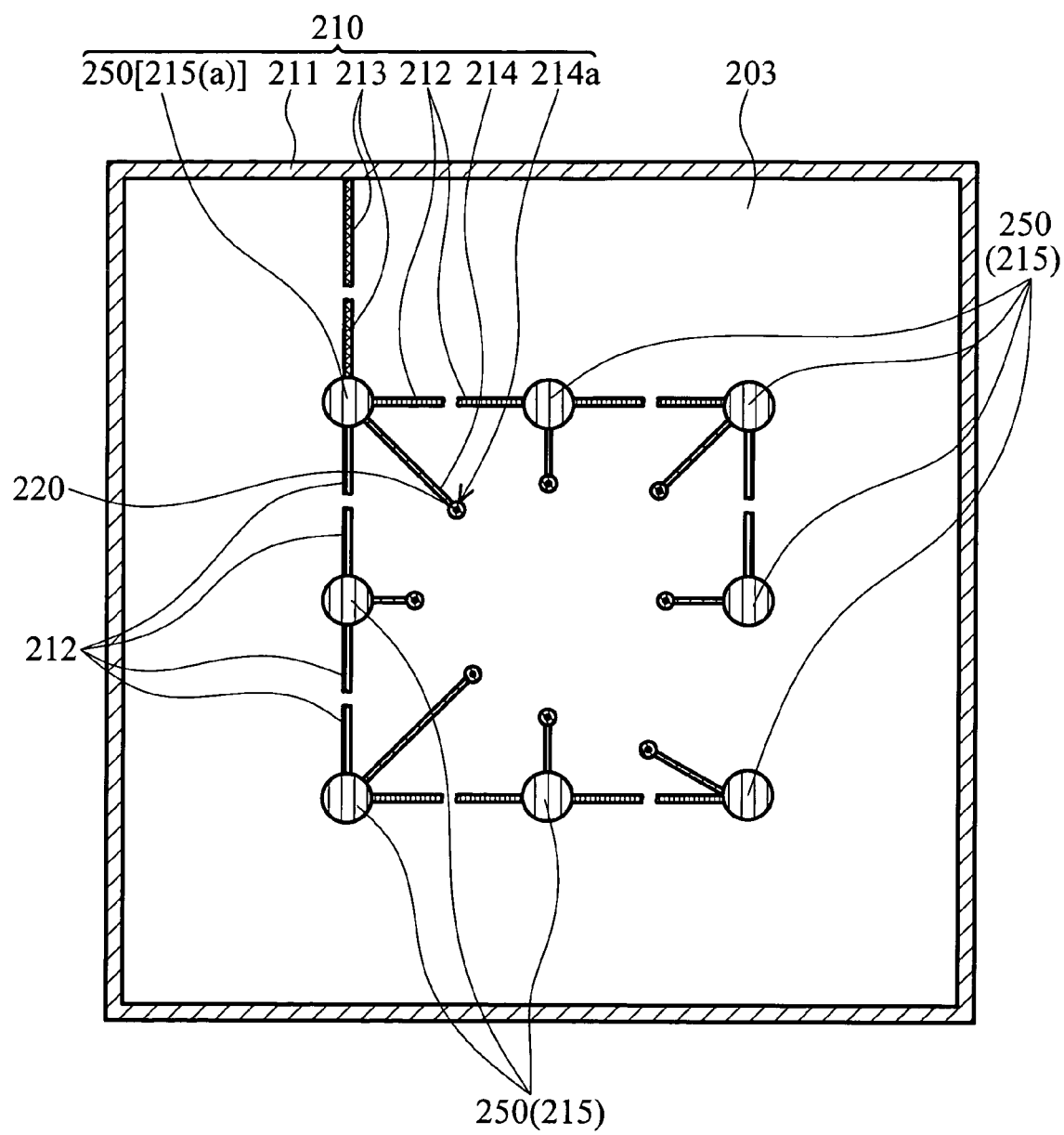

In FIG. 2J, the solder mask 230 is seen transparently, showing the underlying wiring layer 210. Electrical connections between each pad 215 are cut as a result of removing the exposed bridge lines 212.

FIGS. 3A through 3J are top views illustrating a second embodiment of the fabrication method for PCBs of the invention. FIGS. 3A through 3F illustrate an exemplary portion of the PCB of the invention. In practice, the quantity, shape, and size of the elements shown in the figures may be modified.

Figure 3A:
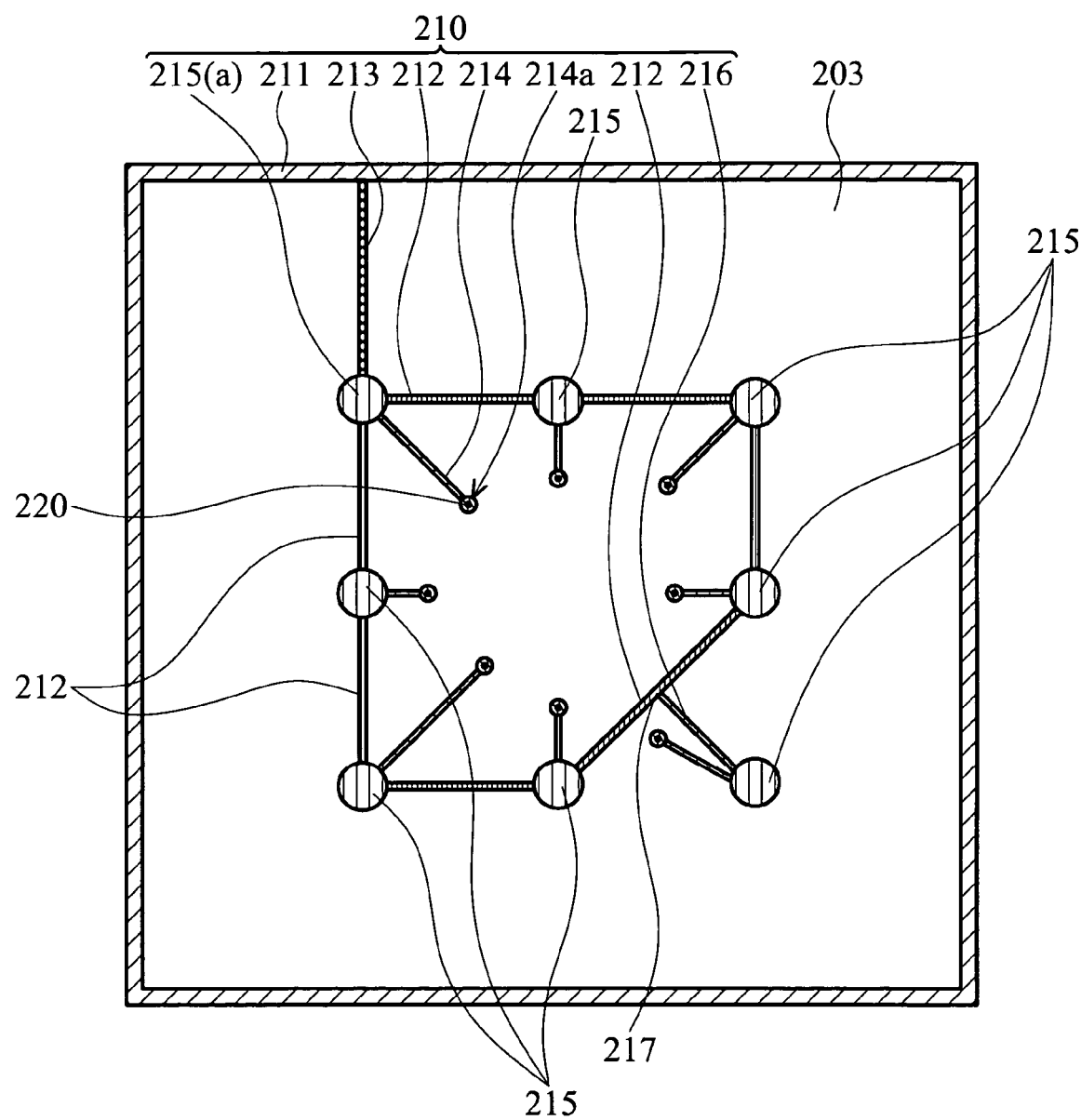
FIGS. 3A through 3F are top views of a fabrication method of PCBs of a second embodiment of the invention.

Arrangements for electrical connection between pads 215 shown in FIG. 3A are different from that shown in FIG. 2B. In this embodiment, a branch bridge line 216 is further formed, extending from a node 217 of one bridge line 212 to one pad 215, to achieve electrical connection between pads 215.

Figure 3B:
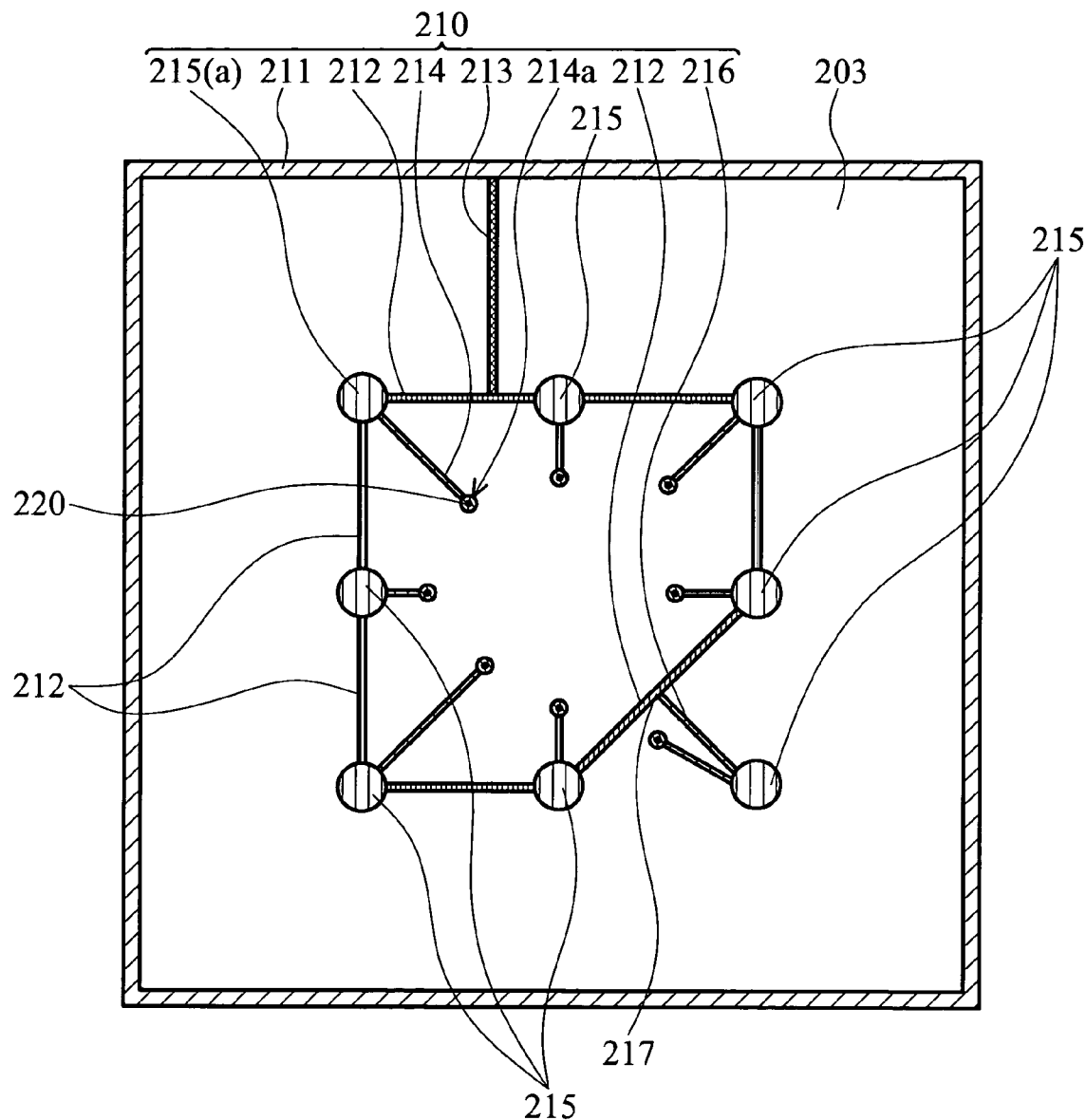
Figure 3C:
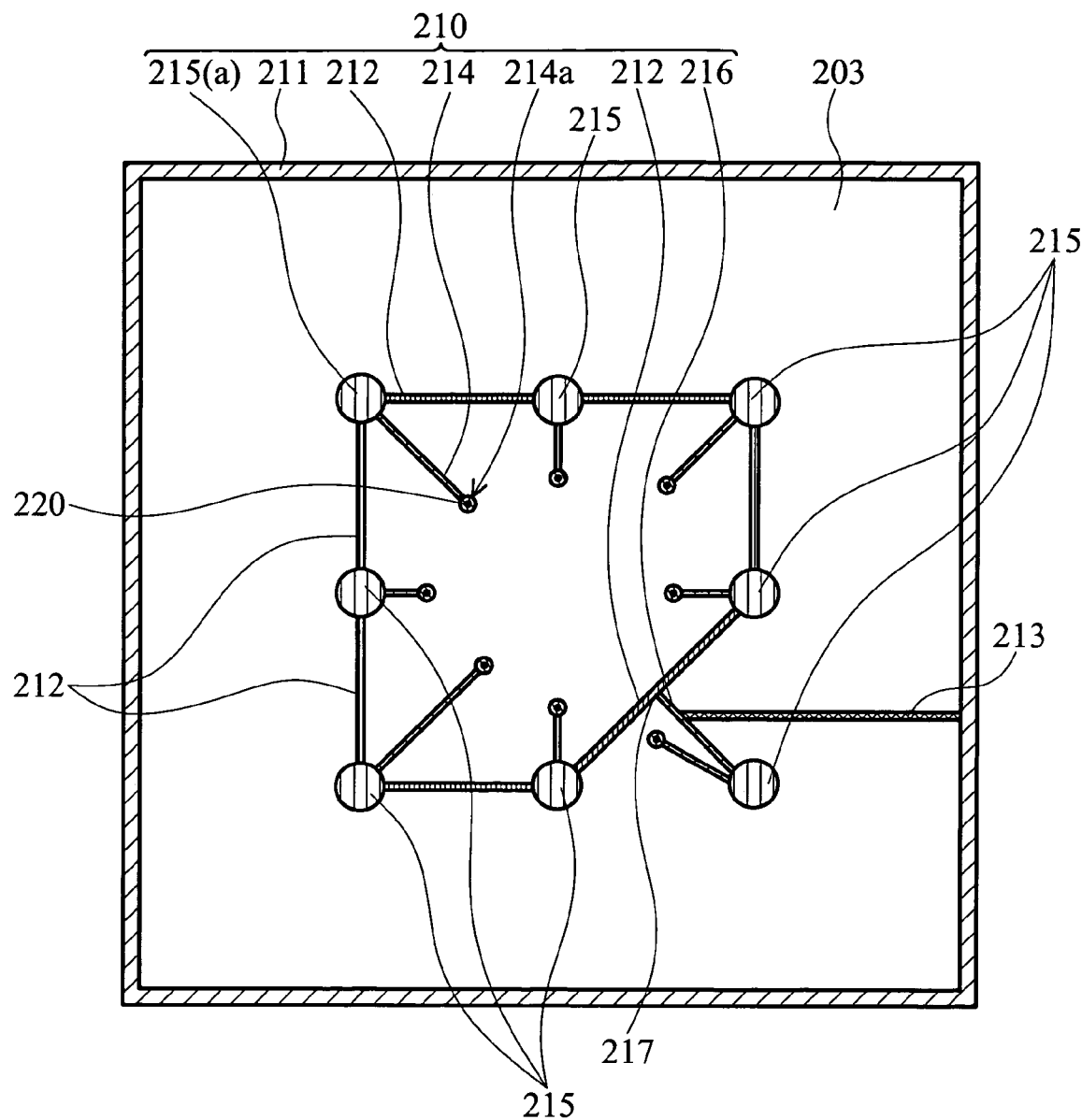

In this embodiment, three exemplary layouts of the plating line 213 are respectively shown in FIGS. 3A through 3C. The plating line 213 is disposed between the bus line 211 and at least one of the pads 215 (pad 215a) in FIG. 3A, between the bus line 211 and at least one of the bridge lines 212 in FIG. 3B, and between the bus line 211 and branch bridge line 216 in FIG. 3B.

The subsequent steps may follow the step shown in FIG. 3A, 3B or 3C, but follows FIG. 3A in this embodiment. Those skilled in the art may develop a substantially equivalent flow following the step shown in FIG. 3B or 3C.

Formation of solder mask 230 and metal layer 250 are substantially equivalent to those shown in FIGS. 2D through 2G, and are omitted herein.

Figure 3D:
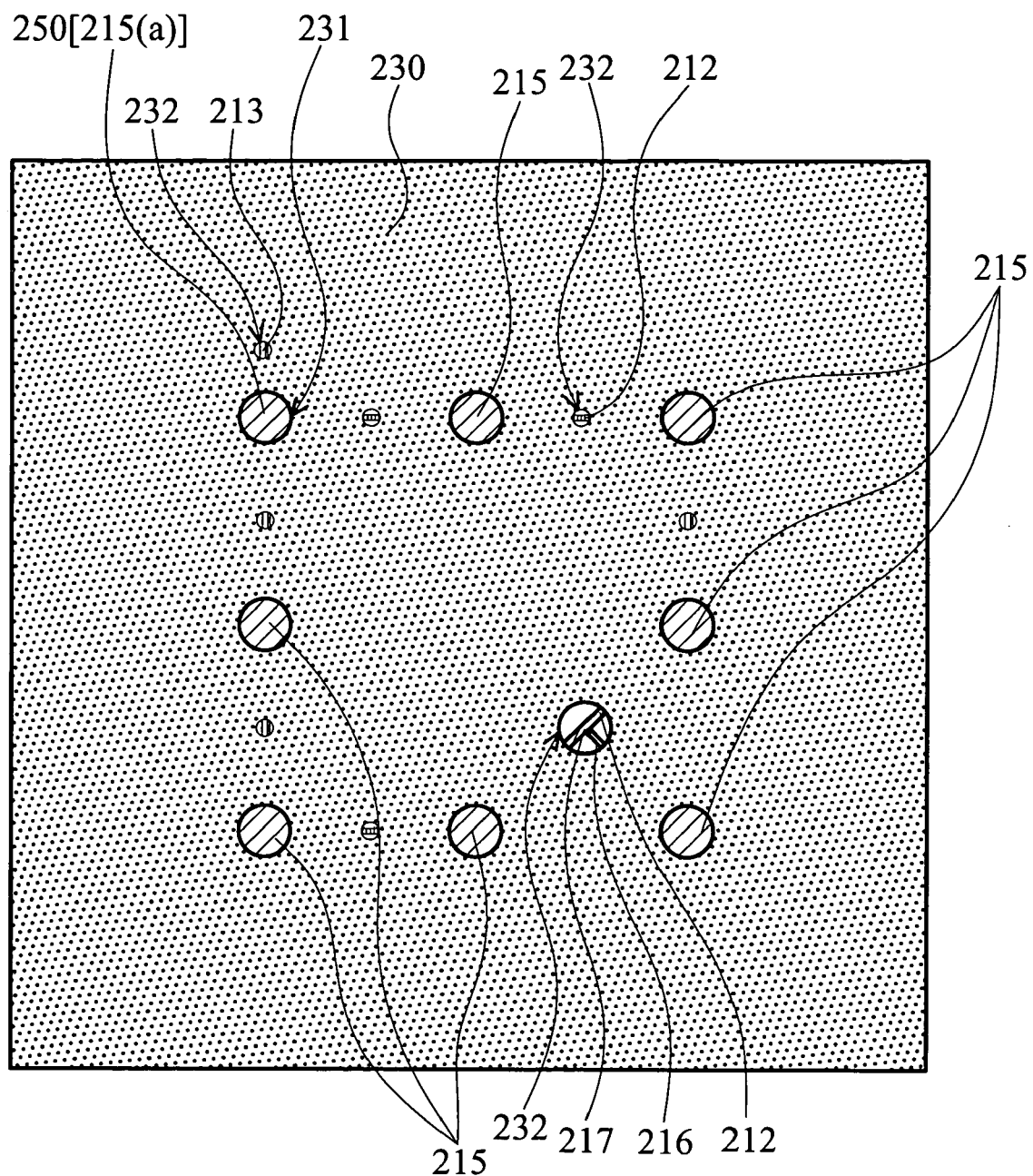

In FIG. 3D, a plurality of second openings 232 are formed in the solder mask 230, exposing parts of bridge lines 212 between pads 215 predetermined for coating, node 217, and parts of bridge line 212 and branch bridge line 216 adjacent to node 217, and a part of the plating line 213 between pad 215a and bus line 211, by a method such as laser absorbing or photolithography.

Figure 3E:
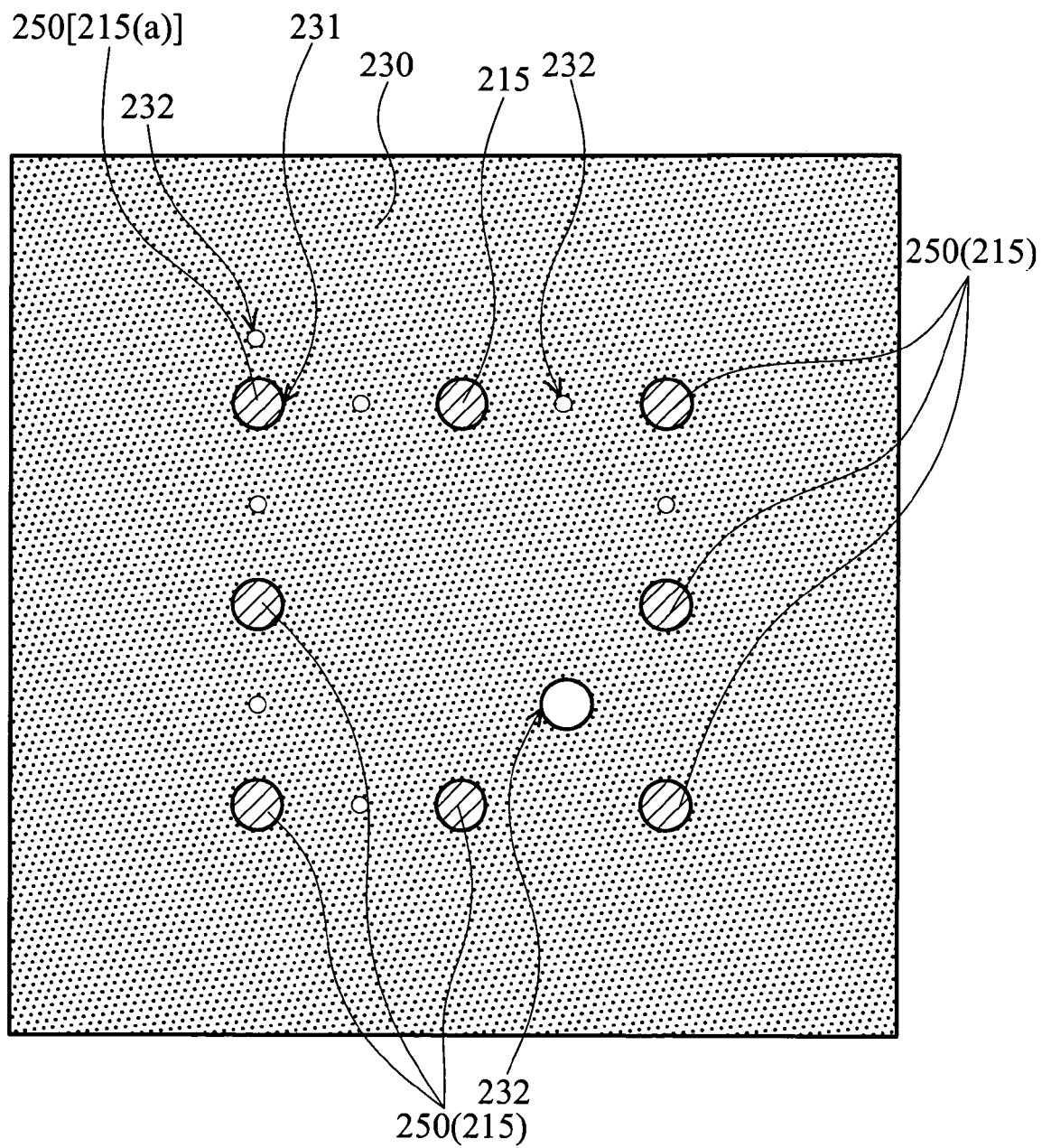

In FIG. 3E, the exposed bridge lines 212, node 217, bridge line 212 and branch bridge line 216 adjacent thereto, and plating line 213 are removed by a method such as etching or laser absorbing.

Figure 3F:
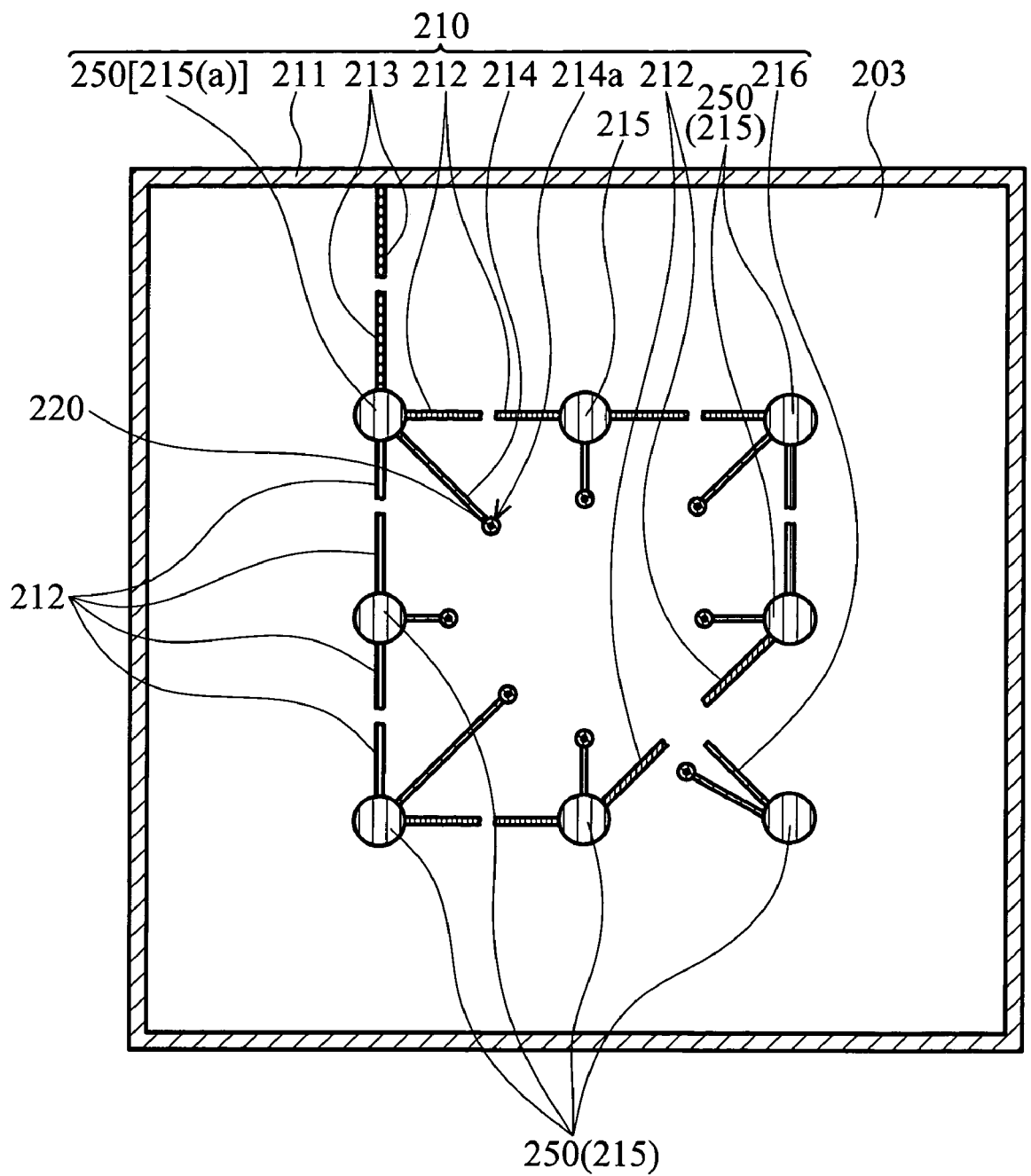

In FIG. 3F, the solder mask 230 is seen transparently, showing the underlying wiring layer 210. Electrical connections between each pad 215 are cut resulting from removal of the exposed bridge lines 212, node 217, bridge line 212 and branch bridge line 216 adjacent thereto, and plating line 213.

As described, electrical connection between pads 215 on the PCB of the invention is provided by bridge lines 212 and further by branch bridge line 216. The pads 215 are further electrically connected to the bus line 211 using plating line 213. Thus, at least one plating line 213 is required for electrical connection between the bus line 211 and pads 215. It is not necessary to form a plurality of plating lines respectively between each pad 215 and bus line 211 as in the known art. Thus, current may flow to each pad 215 using only one plating line 213 to plate metal layer 250 thereon, followed by cutting the electrical connection between pads 215 and between at least one of the pads 215 (pad 215a) and bus line 211, resulting in only one plating line 213 remaining on the PCB, thus preventing crosstalk effect between plating lines, improving electrical performance of an end product using the PCB of the invention.

Although the present invention has been particularly shown and described with reference to the preferred specific embodiments and examples, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A fabrication method for printed circuit boards (PCBs), comprising:
   providing a substrate having a layout area and a periphery area around the layout area on a surface;
   forming a patterned wiring layer, having a bus line in the periphery area, a plurality of pads in the layout area, a plurality of straight bridge lines providing electrical connection between the pads, a branch bridge line providing electrical connection between a node in one of the straight bridge lines and one of the pads, and a plating line electrically connecting the bus line and pads, overlying the substrate, wherein the bus line surrounds the layout area, each of the straight bridge line is disposed in the layout area and has two ends for being physically connected to the two adjacent pads;
   forming a patterned solder mask over the substrate and wiring layer, the patterned solder mask having a plurality of first openings respectively exposing the pads;
   plating a metal layer respectively overlying the pads;
   forming a plurality of second openings in the solder mask, respectively exposing the straight bridge lines between the pads, the plating line between the bus line and pads, and the node; and
   removing the exposed straight bridge lines, plating line, and node.

2. The method as claimed in claim 1, wherein the plating line is disposed between the bus line and at least one of the pads.

3. The method as claimed in claim 1, wherein the plating line is disposed between the bus line and at least one of the straight bridge lines.

4. The method as claimed in claim 1, wherein the plating line is between the bus line and the branch straight bridge lines.

5. The method as claimed in claim 1, wherein the first openings are formed by photolithography.

6. The method us claimed in claim 1, wherein the metal layer comprises Ni/Au.

7. The method as claimed in claim 1, wherein the second openings are formed by laser absorbing.

8. The method as claimed in claim 1, wherein the second openings are formed by photolithography.

9. The method as claimed in claim 1, wherein the exposed straight bridge lines, plating line, and node are removed by etching.

10. The method as claimed in claim 1, wherein the exposed straight bridge lines, plating line, and node are removed by laser absorbing.

* * * * *